(12) United States Patent  (10) Patent No.: US 7,358,702 B2
Kawada et al.  (45) Date of Patent: Apr. 15, 2008

(54) STORAGE BATTERY WITH AUXILIARY TERMINALS

(75) Inventors: Hiroyasu Kawada, Takatsuki (JP);
Kenji Yamauchi, Takatsuki (JP);
Tomohiro Imamura, Takatsuki (JP);
Masamichi Inakura, Takatsuki (JP);
Kenzo Kawakita, Takatsuki (JP);
Susumu Tanaka, Takatsuki (JP)

(73) Assignee: GS Yuasa Corporation, Kyoto (JP)

( * ) Notice: Subject to any disclaimer, the term of this patent is extended or adjusted under 35 U.S.C. 154(b) by 0 days.

(21) Appl. No.: 10/517,279

(22) PCT Filed: May 14, 2003

(86) PCT No.: PCT/JP03/05975

§ 371 (c)(1),
(2), (4) Date: Nov. 15, 2004

(87) PCT Pub. No.: WO03/098721

PCT Pub. Date: Nov. 27, 2003

(65) Prior Publication Data
US 2005/0175893 A1 Aug. 11, 2005

(30) Foreign Application Priority Data
May 15, 2002 (JP) .............................. 2002-139511

(51) Int. Cl.
*H02J 7/00* (2006.01)

(52) U.S. Cl. ..................... 320/112; 429/121; 429/123

(58) Field of Classification Search ................ 320/112, 320/107, 104; 307/46; 429/121, 123
See application file for complete search history.

(56) References Cited

U.S. PATENT DOCUMENTS

| 4,634,642 | A | * | 1/1987 | Lopez-Doriga | |
| | | | | Lopez-Doriga | ............. 429/121 |
| 5,866,274 | A | * | 2/1999 | Mawston et al. | ............... 429/9 |
| 5,877,609 | A | * | 3/1999 | Carter | ......................... 320/103 |
| 5,939,861 | A | * | 8/1999 | Joko et al. | ................... 320/122 |
| 6,121,750 | A | * | 9/2000 | Hwa et al. | ................... 320/104 |
| 2003/0039882 | A1 | * | 2/2003 | Wruck et al. | ............... 429/121 |

FOREIGN PATENT DOCUMENTS

EP 0715365 6/1996

(Continued)

*Primary Examiner*—Adolf Berhane
*Assistant Examiner*—Aaron Piggush
(74) *Attorney, Agent, or Firm*—Berliner & Associates

(57) ABSTRACT

There is provided a storage battery for supplying power to an engine starting circuit and plural electrical parts and accessories, which is structured to prevent all the cords for various circuits and the like from being jammed to a single pair of terminals of the storage battery and prevent power loss during the operation, as well as provide an excellent appearance. The storage battery of the present invention includes a container for accommodation of a plate pack, a lid for covering an opening of the container, main positive and negative terminals connected to the plate pack, and at least one auxiliary terminal connected to at least one of the main positive and negative terminals via a connection member, in which at least a portion of the connection member is embedded in the inside of the lid or located in a recess on the top of the lid.

11 Claims, 5 Drawing Sheets

FOREIGN PATENT DOCUMENTS

| | | |
|---|---|---|
| JP | 62-229758 | 10/1987 |
| JP | HEI-02-31063 | 2/1990 |
| JP | 4-88661 | 7/1992 |
| JP | HEI-04-88661 | 7/1992 |
| JP | HEI-04-106847 | 9/1992 |
| JP | 5-258813 | 10/1993 |
| JP | 62-82566 | 10/1994 |
| JP | 7-57720 | 3/1995 |
| JP | HEI-07-22460 | 4/1995 |
| JP | HEI-08-329924 | 12/1996 |
| JP | 09147817 | 6/1997 |
| JP | 10-270009 | 10/1998 |
| JP | 11016622 | 1/1999 |
| JP | 2001-216953 | 8/2001 |

* cited by examiner

STORAGE BATTERY WITH AUXILIARY TERMINALS

FIELD OF THE INVENTION

The present invention relates to a storage battery and more particularly a storage battery required to simultaneously supply power to plural circuits.

BACKGROUND OF THE INVENTION

For example, a lead-acid storage battery for automobile use supplies power to a large number of electrical parts and accessories such as a horn, lighting lamps, direction or stop indicator lamps, air conditioner, car radio, interior lamps and cigarette lighter, as well as to an engine starting circuit.

FIG. 5 is a perspective view illustrating an apperance of a conventional lead-acid storage battery 15 for automobile use, in which reference numerals 2 and 3 respectively represent a lid and a container, both of which are made of resin. The lead-acid storage battery 15 includes a pair of terminals comprising a single positive terminal 4 and a single negative terminal 5. Power supply cords for the engine starting circuit and various electrical parts and accessories are respectively connected to these terminals. Alternatively only the cord for the engine starting circuit is connected to the terminals, while the cords for various electrical parts and accessories are connected to the engine starting circuit, from which power is branched off.

A connection form with all the cords connected to the pair of terminals of the storage battery is not desirable in appearance since a large number of cords are laid on the top of the storage battery. Another problem associated with this is that replacement of the storage battery becomes troublesome because of the need to detach these plural cords.

A connection form with only the cord for the engine starting circuit connected to the pair of terminals of the storage battery necessitates all the current to flow through a single cord and accordingly requires a thick cord. Another problem is that concentration of all the current in a single cord results in great power loss during transmission.

For the connection of a large number of cords or a single, thick cord to the pair of terminals, these terminals must be greatly protruded from the top of the storage battery, which causes a problem of causing a large dead space above the storage battery.

Also, in addition to conventional electrical parts and accessories, a device for announcing the life of a storage battery, an automobile antitheft device and the like have been developed in these days. These devices also require supply of power from the storage battery and therefore a number of cords to be connected to the terminals of the storage battery is expected to be increased in the future, which results in tendency to make those problems even more apparent.

In order to address those problems, several proposals were made in such as Japanese Patent Application Laid-open No. Hei-5-258813, in which a power distribution unit made up of the combination of an external power-distribution block and a connector is mounted to the storage battery is proposed. In Japanese Patent Application Laid-open No. 2000-30689, a connection form with the terminals of a storage battery connected to electric cords via a coupler is proposed.

However, these connectional forms are expensive and require a large space for the connection of the cords.

In consideration of these problems associated with the conventional arts, it is an object of the present invention to provide a storage battery that causes a small power loss during transmission and has a desirable appearance.

SUMMARY OF THE INVENTION

A storage battery of the present invention is characterized by that it includes main positive and negative terminals that are connected to a plate pack, and at least one auxiliary terminal that is connected via a connection member to at least one of the main positive and negative terminals.

With the storage battery of the present invention, cords from various circuits thus connected to those plural terminals are spaced apart from each other, so that the cords are prevented from being jammed to the limited terminals. Also, attaching and detaching of the cords at the time of replacement of the storage battery can be facilitated as compared with a conventional storage battery.

The connection member is preferably made of lead or lead alloy.

Japanese Patent Application Laid-open Nos. Hei-6-124698 and Hei-10-92412 propose storage batteries designed to be adaptable for both R-type and L-type. However, these are designed to be adapted to any one of rightward and leftward orientations, and therefore are designed for the purpose different from a purpose of the present invention that is to enable simultaneous supply of power through plural terminals.

The storage battery of the present invention may further include a container for accommodation of the plate pack, and a lid for covering an opening of the container, in which at least a portion of the connection member is embedded in the inside of the lid or located in a recess on the top of the lid. This arrangement is preferable since the connection member is prevented from being protruded from the top of the storage battery.

It is preferable to embed the aforesaid at least a portion of the connection member, which is located in the recess on the top of the lid, in resin filled and cured in the recess, since this arrangement is effective in preventing leakage of electrolyte.

An arrangement with a ring-shaped protrusion provided on the side of the at least a portion of the connection member embedded in the inside of the lid or embedded in the resin filled and cured in the recess is effective in preventing a phenomenon, in which electrolyte moves upward through the surface of the connection member.

Also, the arrangement with the auxiliary terminal located in the recess formed on the top of the lid prevents the auxiliary terminal from being protruded from the top of the storage battery, and therefore is able to prevent a lot of cords connected to the auxiliary terminal from being laid on the top of the storage battery, thus providing a desirable appearance.

The connection member is preferably formed monolithical with a bushing that is in turn formed monolithical with each of the main terminals, thereby preventing a gap from being caused between the lid, and the bushing and the connection member embedded in the lid. Thus, leakage of electrolyte from the main and auxiliary terminal portions can be prevented.

It is possible to prevent a phenomenon in which electrolyte moves upward to the surface of the connection member by providing the connection member with a downwardly extending portion and a horizontal portion, in which the downwardly extending portion obliquely extends from an upper portion of the bushing to the horizontal portion. As an additional effect, a force applied to the above monolithically formed part is dispersed, thereby preventing the bushing, the connection member or the like from being deformed.

BEST MODE FOR CARRYING OUT THE INVENTION

Now, the description will be made by taking for example a lead-acid storage battery for automobile use, to which the present invention is effectively applicable.

Figure 1:
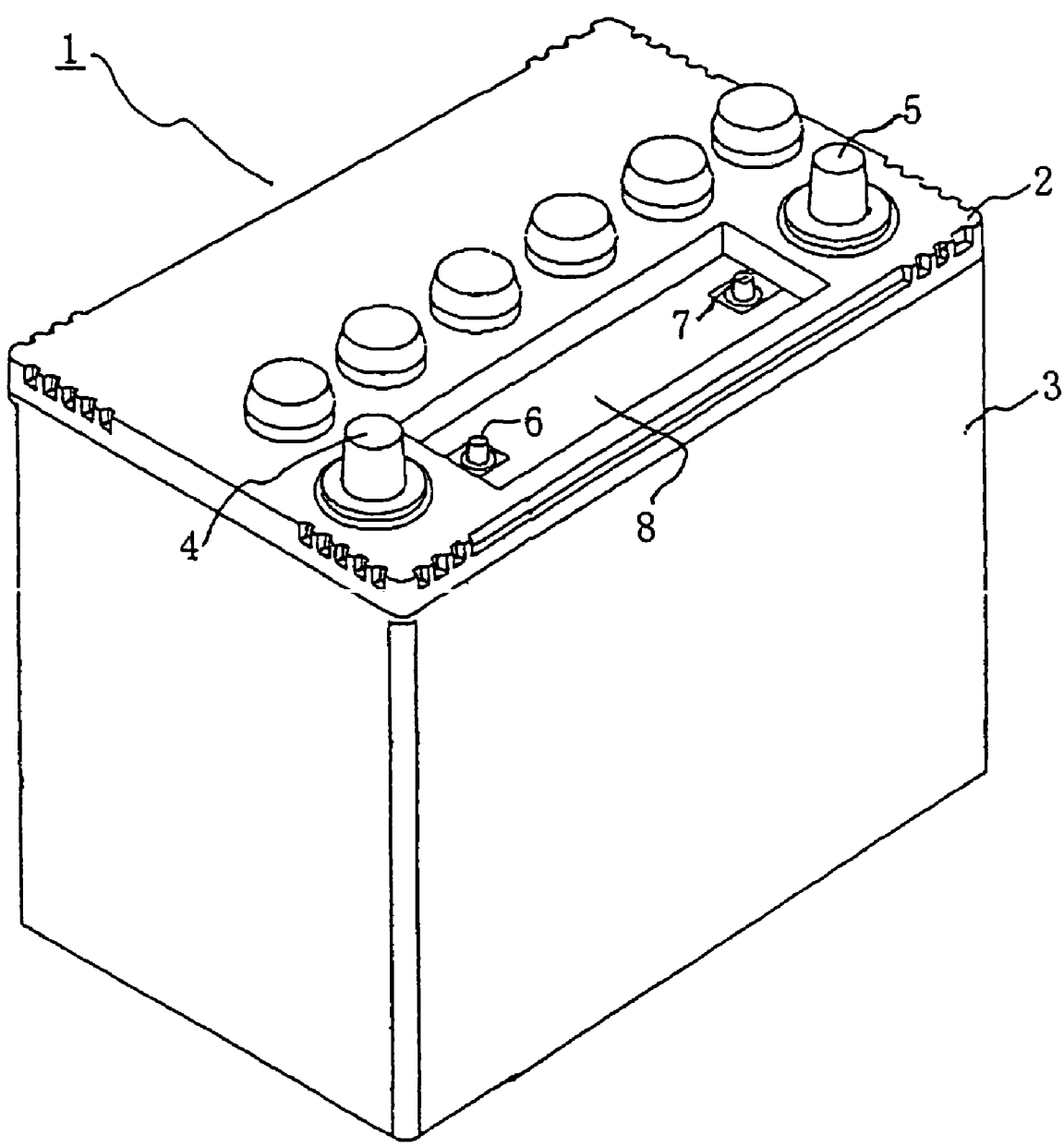
FIG. 1 is a perspective view illustrating an appearance of a storage battery according to a first embodiment of the present invention.

FIG. 1 is a perspective view illustrating an appearance of a lead-acid storage battery 1 according to a first embodiment of the present invention. The lead-acid storage battery 1 includes a main positive terminal 4 and a main negative terminal 5 on the top of a lid 2. The main terminals 4, 5 are made of lead or lead alloy. The lead-acid storage battery 1 also includes an auxiliary positive terminal 6 and an auxiliary negative terminal 7 in addition to the main terminals 4, 5. Both the auxiliary terminals 6, 7 are located in a recess 8 on the top of the lid 2. The main positive terminal 4 and the main auxiliary terminal 6, and the main negative terminal 5 and the auxiliary negative terminal 7 are connected to each other within the inside of the lid 2.

Figure 2:
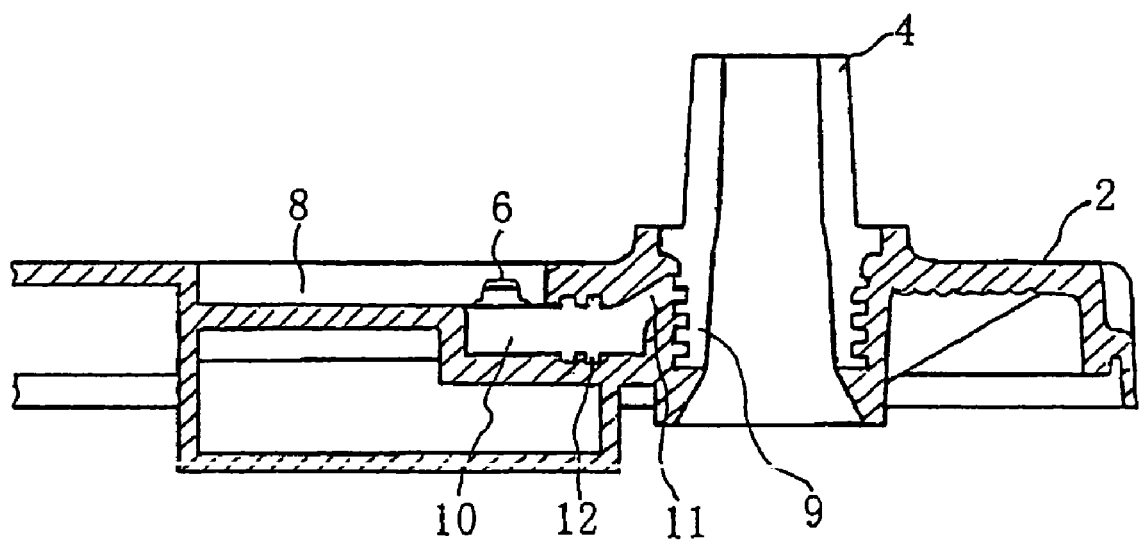
FIG. 2 is a cross sectional view of a terminal portion of the storage battery according to the first embodiment of the present invention.

FIG. 2 is a partially cross sectional view of the lead-acid storage battery 1 and more particularly a cross sectional view of the terminal portion (The positive and negative terminals have a common structure. Herein, the positive terminal portion is taken for illustration). In FIG. 2, a reference numeral 9 represents a bushing located on the lower side of the main terminal 4. The bushing 9 is a member made of lead or lead alloy and monolithically molded with the main terminal 4, and is embedded by insert molding in the lid 2, that is a resin-molded product. This structure is broadly employed for lead-acid storage batteries.

The auxiliary terminal 6 is connected to the bushing 9 via a connection member 10 made of lead or lead alloy. The connection member 10 is monolithically molded with the bushing 9 and the main terminal 4.

The auxiliary terminal 6 is thus connected to the main terminal 4 via the connection member 10 and the bushing 9. The location of the connection member 10 in the present invention is not limited but is preferable embedded in the lid 2 in the course of molding the lid 2 in the same manner as the bushing 9 in order to prevent the connection member 10 from being protruded to the outside of the lead-acid storage battery 1, as illustrated in FIG. 2.

Figure 3:
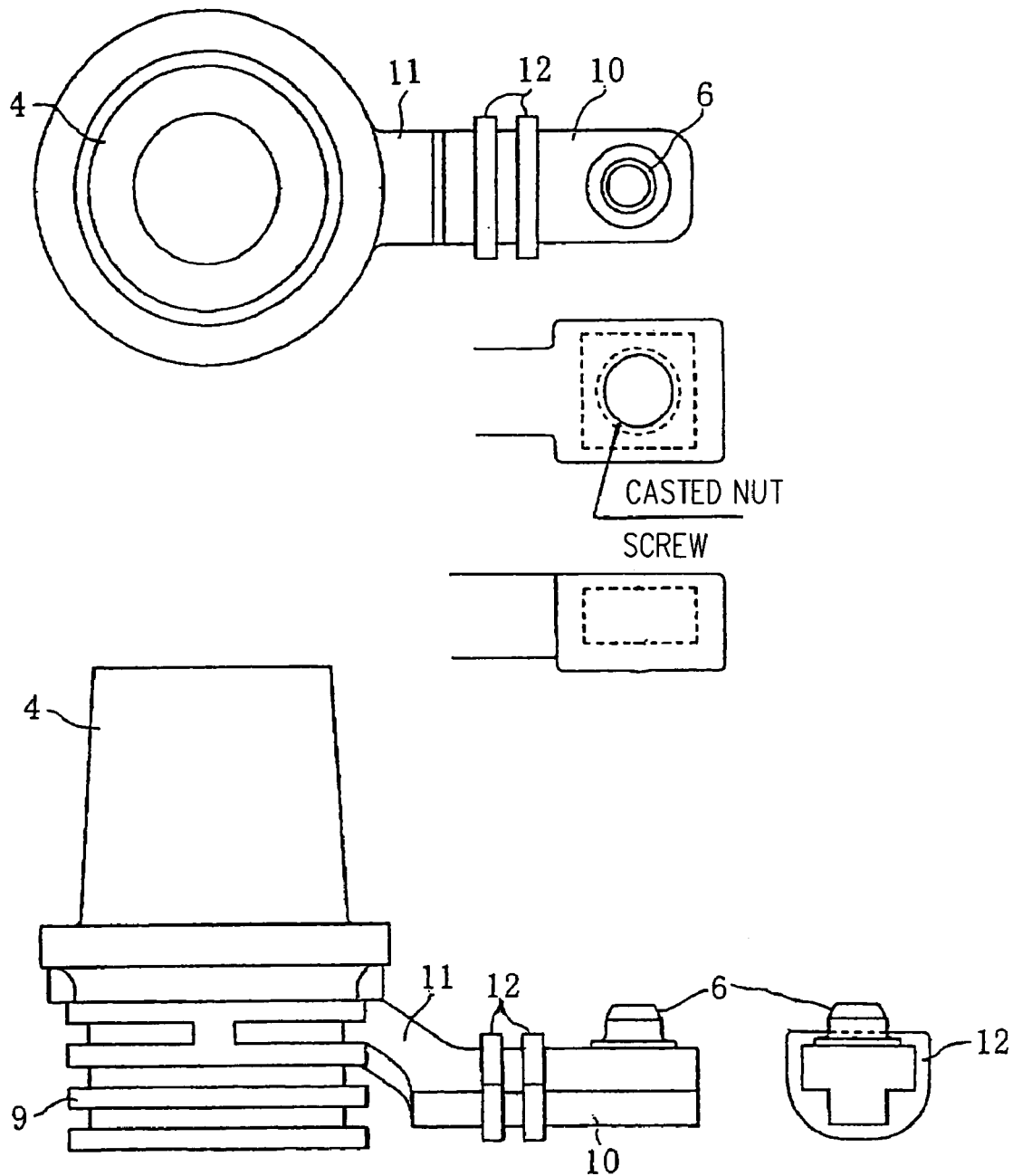
FIG. 3 is an enlarged cross sectional view of a terminal and a connection member of the storage battery according to the first embodiment of the present invention.

FIG. 3 is an enlarged view illustrating an example of the connection forms between the main terminal 4 and the bushing 9, and between the connection member 10 and the auxiliary terminal 6. In FIG. 3, the connection member 10 extends downward from the bushing 9 to a horizontal portion of the connection member 10. A downwardly extending portion 11 of the connection member 10, which extends downward from the bushing 9, can thus allow the connection member 10 to be connected to an upper portion of the bushing 9.

As well known, the bushing 9 is joined to a post of a plate pack. Dilute sulfuric acid as electrolyte tends to move upward through the surface of the post and further the surface of the bushing 9. The connection member 10 having a structure of this embodiment as illustrated in FIG. 3 is joined to the upper portion of the bushing 9 so as to have the distance through which electrolyte moves upward increased, so that electrolyte can be prevented from moving upward to the surface of the connection member 10.

Figure 4:
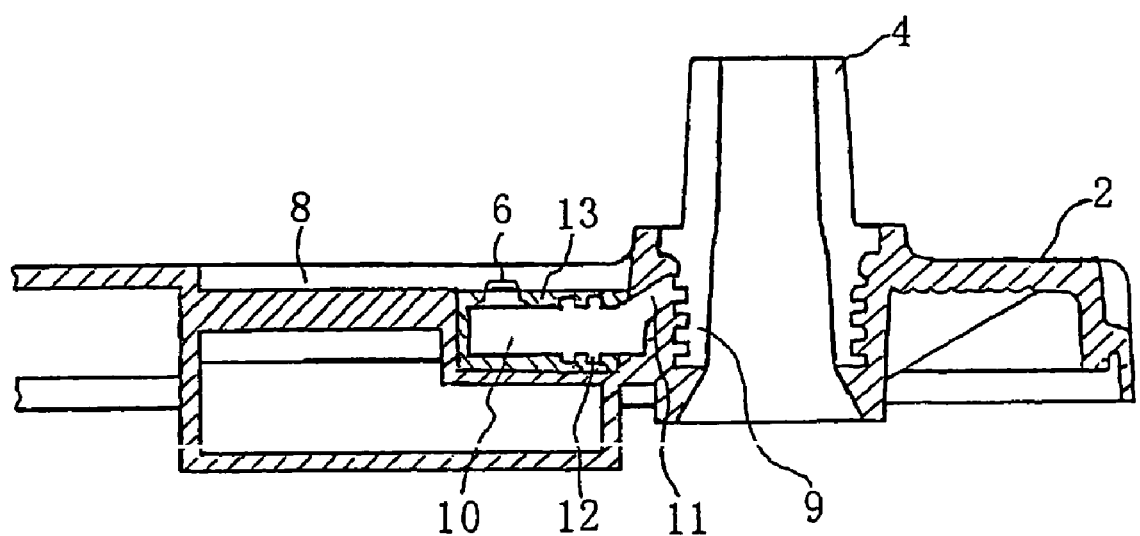
FIG. 4 is a cross sectional view of a terminal portion of the storage battery according to another embodiment of the present invention.
Figure 5:
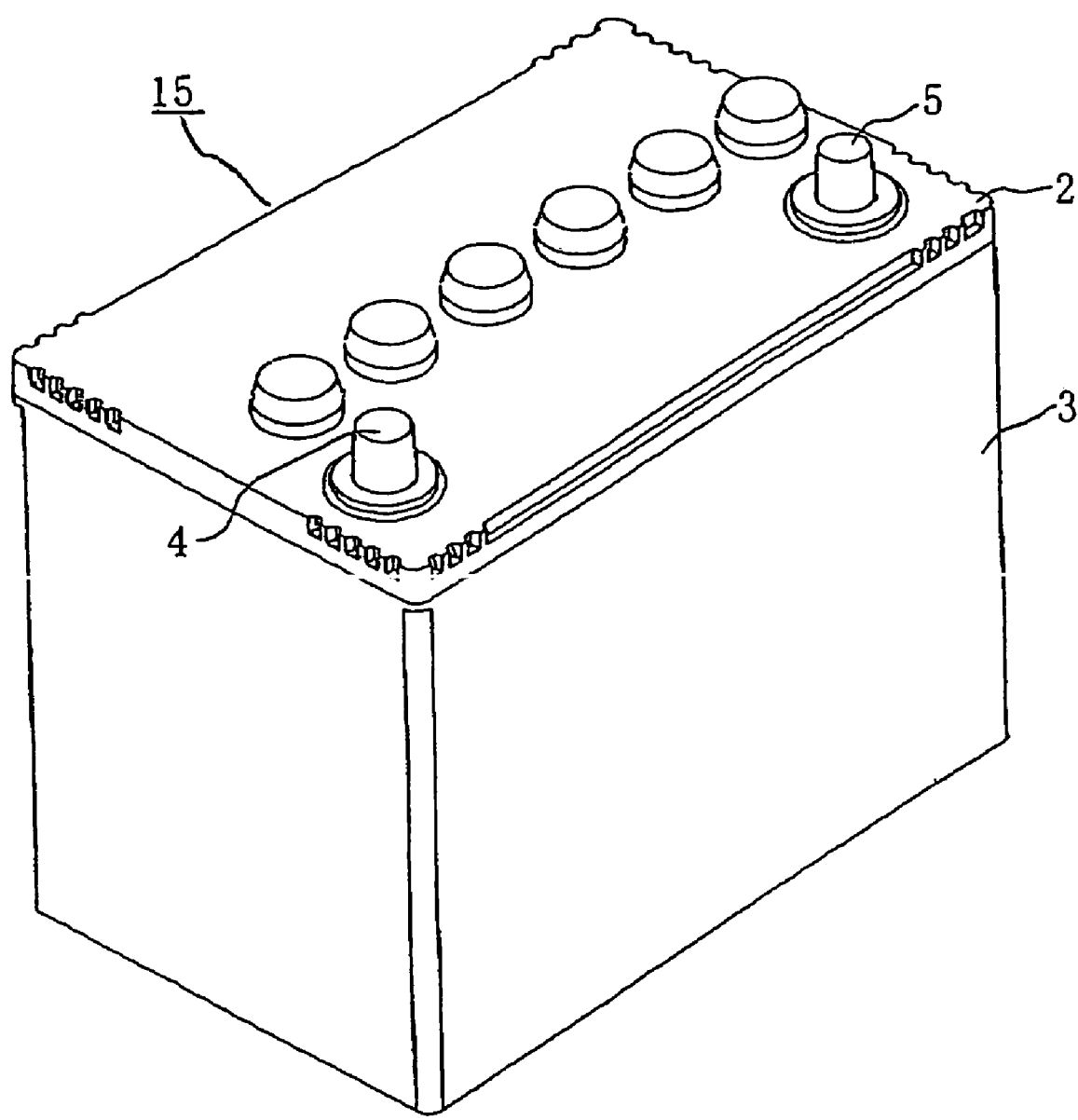
FIG. 5 is a perspective view illustrating an appearance of the conventional storage battery.

FIG. 4 is a view illustrating another embodiment of the present invention. In this embodiment, the lid 2 has on its top a recess 8, and the connection member 10, which is molded monolithically with the bushing 9, is located in the recess 8. This recess 8 is then filled with for example a thermosetting resin such as epoxy resin. With this resin cured, the connection member 10 is embedded in resin 13 while only the auxiliary terminal 6 is exposed on the surface of the resin 13.

In the present invention, as illustrated in such as FIGS. 2 and 4, a ring-shaped protrusion 12 is preferably formed on a portion of the connection member 10, which portion is embedded in the lid 2 or the resin 13. The protrusion 12 as provided can increase the distance, through which electrolyte moves to the surface of the connection member 10, and hence prevent electrolyte from moving upward to the auxiliary terminal 6 through the surface of the connection member 10.

It is technically possible to join the bushing 9 to the connection member 10 by welding or the like, but heat of the welding may cause deformation of the resin-made lid 2 at its portion in contact with the bushing 9 and hence cause a gap between the bushing 9 and the lid 2. In order to avoid such a problem, it is preferable to form the bushing 9 and the connection member 10 by casting so as to be monolithical with each other. Of an monolithical part comprising the bushing 9 and the connection member 10, at least a bushing portion is embedded in the resin of the lid 2 in the course of molding the lid 2.

At the time of molding the lid 2 by setting the aforesaid monolithical part in a die during the insert molding, it is necessary to hold the monolithical part in position by applying pressure to the monolithical part against pressing force of the resin during molding the lid 2 with this resin. At this time, soft lead or lead alloy must be prevented from being deformed. The downwardly extending portion 11 which obliquely extends from the upper portion of the bushing 9 to the horizontal portion of the connection member 10 produces an effect of dispersing the force applied to the monolithical part, thus preventing the deformation of the bushing 9, the connection member 10 and the like.

The shape of the auxiliary terminal is not necessarily limited to a specific one in the present invention, and may be varied so as to be matched to the shape of a cord to be connected. For a cord having a ring-shaped end enabling fitting connection, a protruding terminal, which looks like the auxiliary terminal 6 of FIG. 2, is suitable. For a cord having a ring-shaped or Y-shaped end such as a crimp-type terminal lug enabling fastening connection by nut tightening, the auxiliary terminal is preferably of a bolt shape. For a cord having an outwardly threaded end such as a bolt or screw, the auxiliary terminal preferably has an inwardly threaded portion, as illustrated in FIG. 3; on the other hand, for a cord having an inwardly threaded end, an outwardly threaded portion is applied thereto. For a cord having a pin-, banana plug- or bullet-shaped plug end enabling socket connection, the auxiliary terminal preferably has a through-hole for receiving the end of the cord.

The locations of the auxiliary terminals are not necessarily limited to specific ones. They can be properly located by changing the length, shape and the like of the connection members. For example, the auxiliary terminals may be located either on the top or a side of the lid 2. Also, as illustrated in FIG. 1, at least the auxiliary terminals among the main and auxiliary terminals may be located in the recess 8 of the lid. This arrangement is preferable because the auxiliary terminals can be prevented from being protruded from the top of the lid.

According to the present invention, in which the auxiliary terminals are provided in addition to the main terminals, it is possible to employ a separate connection arrangement where, for example, a cord for an engine starting circuit is connected to the main terminals while cords for circuits for driving other electrical parts and accessories are connected to the auxiliary terminals. Also, the separate connection arrangement with the main terminals located away from the auxiliary terminals can prevent the cords from being located to the limited areas.

According to the embodiment of the present invention, in which the connection member 10 is embedded in the inside of the lid 2 or located in the recess 8 on the top of the lid 2, the connection member 10 can be prevented from being protruded outward from the lead-acid storage battery 1. As a result, a dead space is not caused on the top of the lead-acid storage battery 1 and an excellent appearance can be produced.

Also, an unoccupied space of the recess 8 can be effectively utilized by incorporating a device for announcing the life of the lead-acid storage battery 1, an automobile antitheft device and the like in the recess 8 of the top of the lid 2.

The above description was made by taking for example the storage battery for automobile use, but the present invention is not necessarily limited thereto. For example, the present invention is applicable to a lead storage battery, alkali storage battery or the like for the use other than the automobile use. Also, the auxiliary terminals which are provided in pair may be provided in two or more pairs according to needs and circumstances. The auxiliary terminals installed are not necessarily limited to the pair of positive and negative terminals. It is not necessary to match auxiliary positive terminals in number to auxiliary negative terminals. For example, an auxiliary terminal may be provided for either positive or negative pole, so that the auxiliary terminal may be connected only to a main positive terminal.

The invention claimed is:

1. A storage battery comprising:
    main positive and negative terminals that are connected to a plate pack;
    at least one auxiliary terminal that is connected via a connection portion to at least one of the main positive and negative terminals, said at least one auxiliary terminal having a shape smaller than the shape of each of the main positive and negative terminals;
    a container for accommodation of the plate pack; and
    a lid for covering an opening of the container; wherein
    said lid has on its top a recess that has an area greater than the at least one auxiliary terminal and a closed side wall having an upper peripheral edge connected to a top surface of the lid,
    at least one of said main positive and negative terminals are partly embedded in the lid,
    said connection portion has a part embedded inside of the lid that extends from the at least one of the main positive and negative terminals embedded in the lid, and has an end protruding from the inside of the lid to the inside of the recess, and
    said at least one auxiliary terminal is located at the protruding end.

2. The storage battery according to claim 1, wherein the end of the connection portion that protrudes to the inside of the recess on the top of the lid is embedded in resin filled and cured in the recess, so that said at least one auxiliary terminal is exposed on the surface of said resin.

3. The storage battery according to claim 2, wherein said part of the connection portion embedded inside of the lid has on its side a ring-shaped protrusion.

4. The storage battery according to claim 1, further comprising a bushing monolithically formed with each of the main positive and negative terminals, wherein said connection portion is connected via the bushing to each of the main positive and negative terminals.

5. The storage battery according to claim 4, wherein the connection portion has a proximal end, said proximal end being a downwardly extending portion obliquely extending from an upper portion of the bushing.

6. The storage battery according to claim 5, wherein the connection portion is monolithically formed with the bushing.

7. The storage battery according to claim 1, wherein said recess on the top of the lid extends between the main positive and negative terminals, and said at least one auxiliary terminal inside of the recess comprises a pair of auxiliary terminals that are respectively connected to the main positive and negative terminals, and said main positive and negative terminals and said pair of auxiliary terminals are aligned in a substantially straight line.

8. The storage battery according to claim 1, wherein said at least one auxiliary terminal in the recess on the top of the lid is disposed so as not to protrude outward from the top of the lid.

9. The storage battery according to claim 1, wherein the recess on the top of the lid provides a space, through which any one of a device for announcing the life of the battery and an automobile antitheft device is incorporated with the storage battery.

10. The storage battery according to claim 1, wherein the at least one auxiliary terminals is located within the recess.

11. The storage battery according to claim 1, wherein the majority of the top of the lid is flat.

* * * * *